US008488387B2

(12) United States Patent
Lue et al.

(10) Patent No.: US 8,488,387 B2
(45) Date of Patent: Jul. 16, 2013

(54) THERMALLY ASSISTED DIELECTRIC CHARGE TRAPPING FLASH

(75) Inventors: Hang-Ting Lue, Hsinchu (TW); Chih-Ping Chen, Tainan (TW); Chih-Chang Hsieh, Taipei (TW); Yi-Hsuan Hsiao, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 206 days.

(21) Appl. No.: 13/099,298

(22) Filed: May 2, 2011

(65) Prior Publication Data

US 2012/0281481 A1 Nov. 8, 2012

(51) Int. Cl.
*G11C 16/04* (2006.01)

(52) U.S. Cl.
USPC .................................. 365/185.23; 365/185.18

(58) Field of Classification Search
USPC ...................................................... 365/185.23
See application file for complete search history.

(56) References Cited

U.S. PATENT DOCUMENTS

| 6,009,033 | A   | * | 12/1999 | Li et al. .......................... 365/212 |
| 6,251,717 | B1  |   | 6/2001  | Ramsbey et al. |
| 7,301,818 | B2  | * | 11/2007 | Lu et al. ..................... 365/185.24 |
| 7,315,474 | B2  |   | 1/2008  | Lue |
| 7,382,654 | B2  |   | 6/2008  | Hsu et al. |
| 7,626,228 | B2  | * | 12/2009 | Park et al. ...................... 257/326 |
| 7,704,847 | B2  | * | 4/2010  | Cannon et al. ................ 438/382 |
| 7,709,334 | B2  | * | 5/2010  | Lai et al. ....................... 438/287 |
| 8,085,615 | B2  | * | 12/2011 | Taguchi ................... 365/230.06 |
| 8,138,573 | B2  | * | 3/2012  | Cannon et al. ................ 257/538 |
| 8,193,573 | B2  | * | 6/2012  | Bronner et al. ............... 257/314 |
| 8,247,862 | B2  | * | 8/2012  | Babcock et al. .............. 257/321 |
| 8,344,475 | B2  | * | 1/2013  | Shaeffer et al. ............... 257/528 |
| 2009/0039414 | A1 |   | 2/2009  | Lue et al. |
| 2010/0025811 | A1 |   | 2/2010  | Bronner et al. |
| 2010/0246235 | A1 |   | 9/2010  | Gouin |

FOREIGN PATENT DOCUMENTS

| EP | 2048709 A2 | 4/2009 |
| WO | 2011022123 A1 | 2/2011 |

OTHER PUBLICATIONS

Mielke N et al., "Flash EEPROM Threshold Instabilities due to Charge Trapping During Program/Erase Cycling," IEEE Trans. on Device and Materials Reliability, vol. 4, No. 3, Sep. 2004, pp. 335-344.

Lee J-D et al., "Effects of Interface Trap Generation and Annihilation on the Data Retention Characteristics of Flash Memory Cells," IEEE Trans. on Device and Materials Reliability, vol. 4, No. 1, Mar. 2004, pp. 110-117.

Wu Q et al., "A First Study on Self-Healing Solid-State Drives," IEEE Int'l Memory Workshop (IMW), May 2011, 4 pp.

(Continued)

*Primary Examiner* — Son Mai

(74) *Attorney, Agent, or Firm* — Haynes Beffel & Wolfeld LLP

(57) ABSTRACT

A memory device includes an array of dielectric charge trapping structures memory cells including word lines and bit lines. Control circuitry is coupled to the array arranged to control read, program and erase operations. A controller is arranged with supporting circuitry thermally annealing charge trapping structures in the memory cells in the array. Word line drivers and word line termination circuits can be used to induce current flow on the word lines to induce heat for the annealing. The thermal annealing can be applied interleaved with normal operations for recover from cycling damage. Also, the thermally annealing can be applied during mission functions like erase, to improve performance of the function.

22 Claims, 15 Drawing Sheets

OTHER PUBLICATIONS

Extended EP Search Report in related application mailed Sep. 20, 2012, 3 pp.

Lue H-T et al., "Scaling Evaluation of BE-SONOS NAND Flash Beyond 20 nm," VLSI Synmposia on Technology, Honolulu HI, 2008, pp. 116-117.

Lue H-T et al., "BE-SONOS: A Bandgap Engineered SONOS with Excellent Performance and Reliability," IEDM Tech. Dig. 2005, pp. 547-550. Hang-Ting Lue; Szu-Yu Wang; Erh-Kun Lai; Yen-Hao Shih; Sheng-Chih Lai; Ling-Wu Yang; Kuang-Chao Chen; Ku, J.; Kuang-Yeu Hsieh; Rich Liu; Chih-Yuan Lu; , "BE-SONOS: A bandgap engineered SONOS with excellent performance and reliability," Electron Devices Meeting, 2005. IEDM Technical Digest. IEEE International , vol., No., pp. 547-550, 5-5 Dec. 2005.

Shin Y. et al., "A Novel NAND-type MONOS Memory using 63nm Process Technology for Multi-Gigabit Flash EEPROMs," IEEE IEDM Tech. Digest, 2005, pp. 327-330.

Shin Y. et al., "High Reliable SONOS-type NAND Flash Memory Cell with Al2O3 for Top Oxide," 19th Non-Volatile Semiconductor Memory Workshop, IEEE, Monterey CA, 2003, pp. 58-59. wdx 158737.

* cited by examiner

THERMALLY ASSISTED DIELECTRIC CHARGE TRAPPING FLASH

BACKGROUND OF THE INVENTION

1. Field of the Invention

The present invention relates to flash memory technology.

2. Description of Related Art

Flash memory is a class of non-volatile integrated circuit memory technology. The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S). More advanced flash memory technology has been developed, using bandgap engineered tunneling dielectrics in dielectric charge trapping cells. One bandgap engineered cell technology is known as BE-SONOS, as described in Hang-Ting Lue et al., "Scaling Evaluation of BE-SONOS NAND Flash Beyond 20 nm", 2008 Symposium on VLSI technology, Digest of Papers, June 2008, and in H. T. Lue et al., IEDM Tech. Dig., 2005, pp. 547-550.

These advanced charge trapping memory technologies can have limited endurance and operation speeds, compared to other memory types.

It is desirable to provide technology improving the speed of operation and endurance of flash memory.

SUMMARY OF THE INVENTION

A memory device is described which includes resources for thermally annealing dielectric charge trapping structures of memory cells on the device. A method for operating an array of dielectric charge trapping memory cells can be applied that includes performing read, program and erase operations; and either interleaved among, or during, the read, program and erase operations, thermally annealing charge trapping structures in the memory cells in the array. Experimental results discussed below show that suitable annealing operations can improve endurance by repairing damage accumulated during program and erase cycling. For example, by periodically annealing memory cells in the array, the effective endurance of the device can be greatly improved, including achieving endurance cycling performance of 1 million cycles or more. Also, by applying the annealing during operations, such as during an erase operation, performance of the affected operation can be improved. During an erase operation for example, thermal annealing can assist electron de-trapping, and thereby improve erase speed.

Integrated circuit memory can be implemented with word line drivers and word line termination circuits, responsive to decoder circuitry and optionally other control circuits, to drive a current on corresponding word lines. The current can cause resistive heating of the selected word lines, that is transferred to the dielectric charge trapping structures for the anneal operation. This and other techniques can be applied to allow flexible delivery of the annealing operation.

The technology described herein is suitable for use with BE-SONOS memory technologies, and other advanced dielectric charge trapping technologies.

Other aspects and advantages of the present technology can be seen on review of the drawings, the detailed description and the claims which follow.

DETAILED DESCRIPTION

A detailed description of embodiments of the present technology is provided with reference to the FIGS. 1-21.

Figure 1:
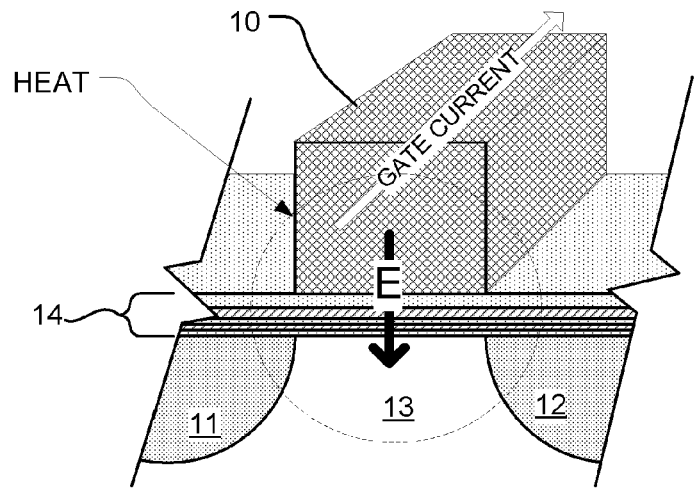
FIG. 1 is a simplified perspective view of a dielectric charge trapping memory cell arranged for thermal anneal operations.

FIG. 1 is a simplified perspective view of a memory cell having a source 11 and a drain 12 in a semiconductor body 13 with a channel region between the source and drain. The word line 10 provides a gate over the channel region of the body 13.

A multilayer dielectric stack 14 is interposed between gate and the channel region of the body 13, and acts as a dielectric charge trapping structure.

One technology for implementation of multilayer dielectric stack 14 is known as bandgap engineered SONOS (BE-SONOS) charge trapping technology. See, for example U.S. Pat. No. 7,315,474 by Lue, which is incorporated by reference as if fully set forth herein.

An example of a BE-SONOS multilayer dielectric stack includes a multilayer tunneling layer on the channel. The multilayer tunneling layer is implemented using a layer of silicon oxide or silicon oxynitride that is less than 2 nm thick in the central region of the channel, a second layer of silicon nitride that is less than 3 nm thick in the central region, and a third layer comprising silicon oxide or silicon oxynitride that is less than 4 nm thick in the central region. The charge trapping layer is formed on the tunneling layer that comprises silicon nitride having a thickness of greater than 5 nm in the central region. The blocking layer is formed between the charge trapping layer and a gate which comprises an insulation material, which has an effective oxide thickness greater than 5 nm in the central region. In other embodiments, the dielectric charge trapping structure can be arranged with the tunneling layer adjacent the gate, and the blocking layer adjacent the channel.

Alternative memory cells may use different charge trapping structures, including for example more traditional nitride structures; charge trapping structures as described in Shin et al., "A Highly Reliable SONOS-type NAND Flash Memory Cell with Al2O3 or Top Oxide," IEDM, 2003 (MANOS); Shin et al., "A Novel NAND-type MONOS Memory using 63 nm Process Technology for a Multi-Gigabit Flash EEPROMs", IEEE 2005; and commonly owned and co-pending U.S. patent application Ser. No. 11/845,276, filed 27 Aug. 2007, which is incorporated by reference as if fully set forth herein.

BE-SONOS technology, and other dielectric charge trapping technologies, can have significant temperature sensitivity. The temperature sensitivity can include the ability to recover from damage to the structure that occurs during program and erase cycling, by a thermal anneal. Therefore by applying a thermal anneal, the charge storage characteristics of the dielectric charge trapping structure can be restored or improved. Also the temperature sensitivity can include improved performance. For example, if heat can be applied during Fowler Nordheim (FN) tunneling, under a negative gate bias, thermally assisted electron de-trapping can be enhanced, and become a significant factor in combination with hole tunneling to improve erase speed.

One technique of applying heat to a memory cell includes resistive heating generated using current in a word line, as illustrated in FIG. 1. Word lines are typically unterminated lines, or terminated with very high impedance, so that a word line driver charges a word line to a target voltage without generating significant current. In order to induce current flow in a word line, the word line receiving the word line voltage needs to be terminated in a manner that allows current flow. Also, in a negative gate voltage FN tunneling operation, electric field is induced across the dielectric charge trapping layer. Thus, a combined erase/anneal operation can be executed by inducing current flow while also inducing electric field to support an erase operation. Current flow can also be induced during read and program operations if desired. Current flow can also be induced while the memory is idle, in operations interleaved with the mission functions of read, program and erase. Therefore, a circuit can be arranged to accomplish the anneal operation interleaved with, or during, read operations, program operations and erase operation.

By suitably inducing current through a word line, the local temperature of the gate for a particular cell can be raised greater than 400° C. Because the gate is in contact with the dielectric charge trapping structure, heat is transferred and accomplishes the anneal.

Figure 2:
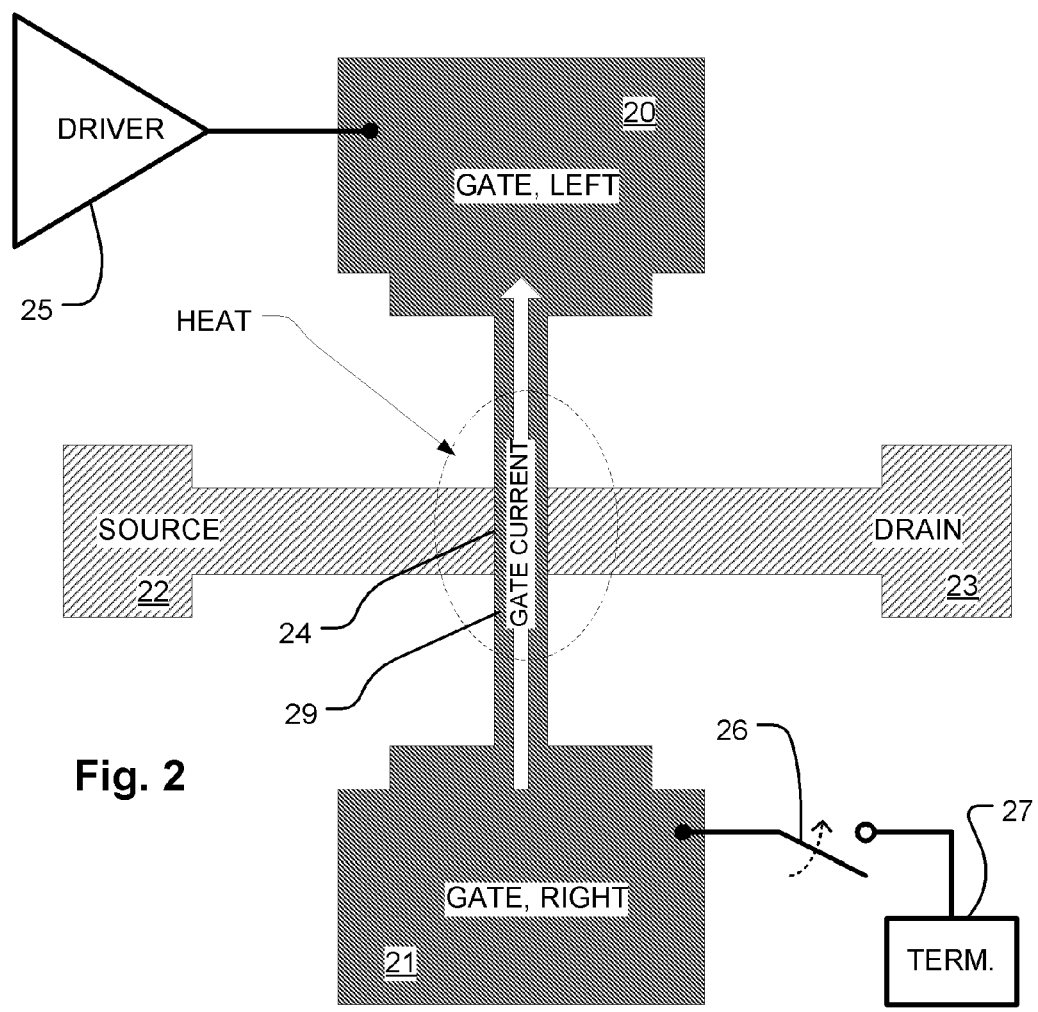
FIG. 2 is a simplified layout diagram of a dielectric charge trapping cell arranged for thermal anneal operations.

FIG. 2 is a simplified single device layout illustration. The device includes a source 22 and a drain 23 implemented by implants in a semiconductor body. The device includes a gate 29. The gate 29 can have locally narrow region in order to locally concentrate current, with wider regions at opposing ends 20 and 21 spaced away from the memory element of the cell. The memory cell is formed at the crosspoint 24 between the gate 29 and the source/drain implant.

As illustrated, annealing can be induced using a word line driver 25 coupled to one end 20 of the gate. A word line termination circuit (which may be similar to a word line driver) is coupled to the opposite end 21 of the gate. Word line termination circuit includes a switch 26 which can be responsive to address decoding or other control circuitry, to selectively couple the word line to a termination circuit 27, which can include bias circuits, to allow current flow or prevent current flow as appropriate. The termination circuits allow for current flow on the gate by applying a voltage difference across the word line. In one example, the termination circuits can be arranged to apply a voltage of about 1 volt on one side of the word line and a voltage of about 0 volts on the other. This causes a current flow, and induces heat at the memory cells, without establishing a significant electric field. In another example, the termination circuits can be arranged to apply about 20 volts on one side and about 19 volts on the other, causing a current flow to induce heat while also inducing electric fields at the memory cells to support programming, including Fowler Nordhiem programming. In another example, the termination circuits can be arranged to apply about −16 volts on one side and about −15 volts on the other, causing a current flow to induce heat while also inducing electric fields at the memory cells to support erasing, including negative field Fowler Nordhiem erasing.

The means for thermally annealing the memory cells described with reference to FIGS. 1 and 2, includes word lines or other gate structures having drivers and termination circuits selectively controlled to induce resistive heating near the dielectric charge trapping structures of the memory cells. In other embodiments, heat may be applied to the dielectric charge trapping structures of the memory cells using current flow in bit lines. Also, the memory cells may be implemented in an array with an additional set of resistive lines, either above the dielectric charge trapping layers, or below. For example, an additional set of thermal anneal lines may be implemented adjacent to or over the standard word lines in a metal layer, and used to heat the cells. Also, the memory cells may be implemented over a substrate that includes a set of thermal anneal lines below the dielectric charge trapping structures. For example, in the case of a silicon on insulator substrate a resistor can be buried below the memory cell, implemented using a doped polysilicon line for example below or embedded within the insulator. Word line heating may be most efficient because of the proximity of the word lines to the charge trapping structure. However, other structures can be used to provide the means for thermally annealing, as outlined above.

Flash memory devices generally are implemented using NAND or NOR architectures, although others are known, including for example virtual ground architectures, AND architectures. The NAND architecture is popular for its high density and high speed when applied to data storage applications. The NOR architecture is better suited to other applications, such as code storage, where random byte access is important. The thermally assisted memory cells described herein can be deployed in NAND, NOR, virtual ground and AND architectures, and in other configurations.

Figure 3:
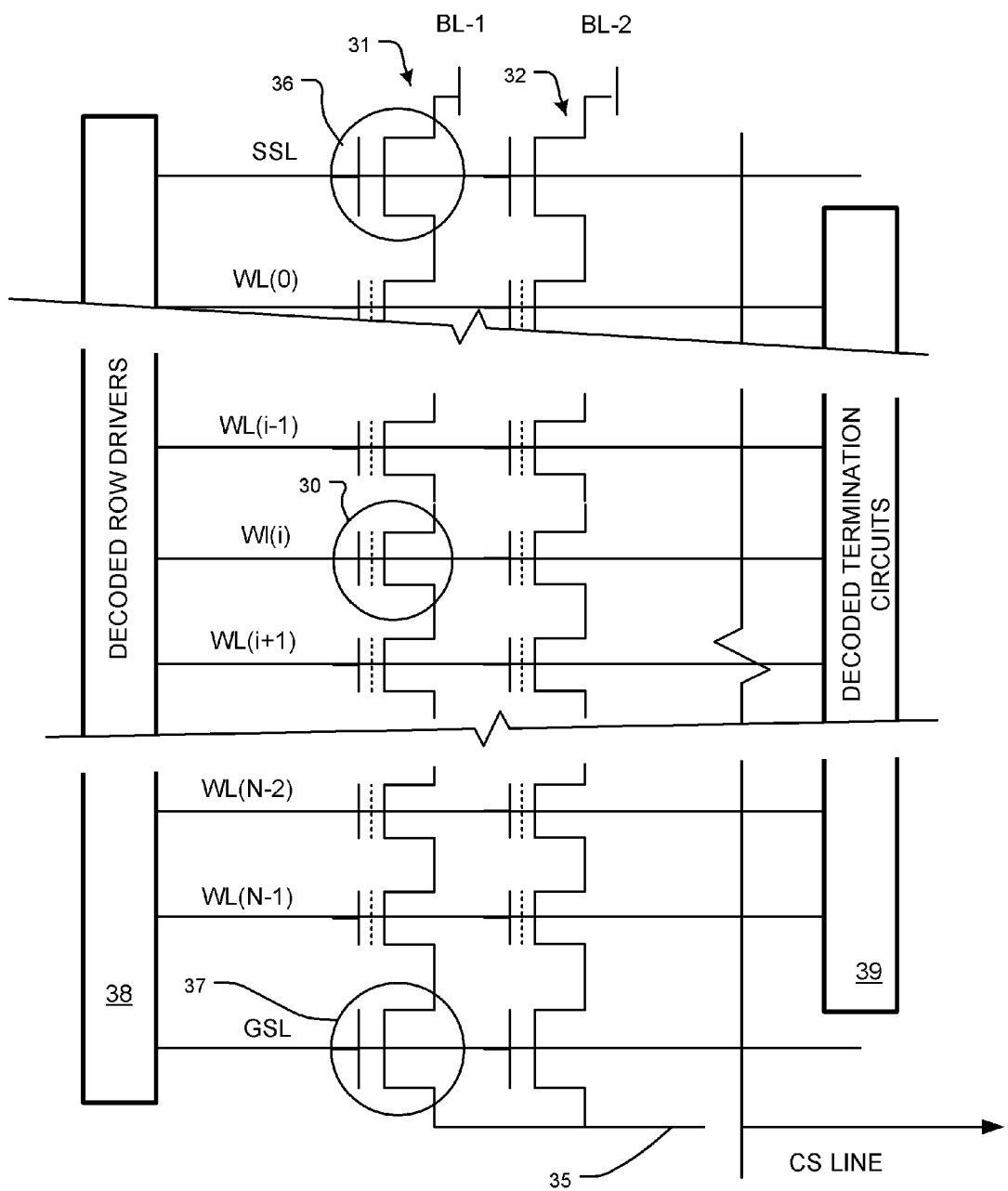
FIG. 3 is a schematic diagram of a common source type NAND-type memory array arranged for thermal anneal operations.

FIG. 3 is a circuit diagram showing layout of a NAND architecture including NAND strings 31, 32 coupled to respective bit lines BL-1 to BL-2 and to a common source CS line 35 by string select transistors (e.g. 36) and ground select transistors (e.g. 37), respectively. For the purpose of illustration, for read of a target memory cell 30 on corresponding word line WL(i) in the NAND string 31, a read bias level is applied to the selected word line WL(i). The unselected word lines are driven with a pass voltage, sufficient to turn on memory cells in the highest threshold state. On the selected bit lines, a read bias is applied. On the unselected bit lines, the bit line voltage is set to ground, or a level close to that of the CS line.

In order to use the word lines to apply heat for a thermal anneal, the array is configured with decoded word line drivers 38 along with decoded termination switches 39 on opposite ends of the word lines. The length of the word lines between the drivers and decoded termination switches 39 can be configured as desired by segmenting the array appropriately. For example, word line driver/termination switch pairs can be implemented for segments of 100 bit lines, segments of 1000 bit lines, or segments of other length, as suits a particular implementation. Using decoded termination circuits 39, which selectively couple the word lines to a bias circuit or decouple the word line from a bias circuit, allows use of the word lines in low current modes during operation of the device, and in higher current modes for thermal anneal. Also, some operating modes of the device, such as read operations, program operations, and erase operations, the word lines may be operated in a high current mode, with the word lines selectively coupled to termination circuits, to perform thermal anneal during the operation.

Figure 4:
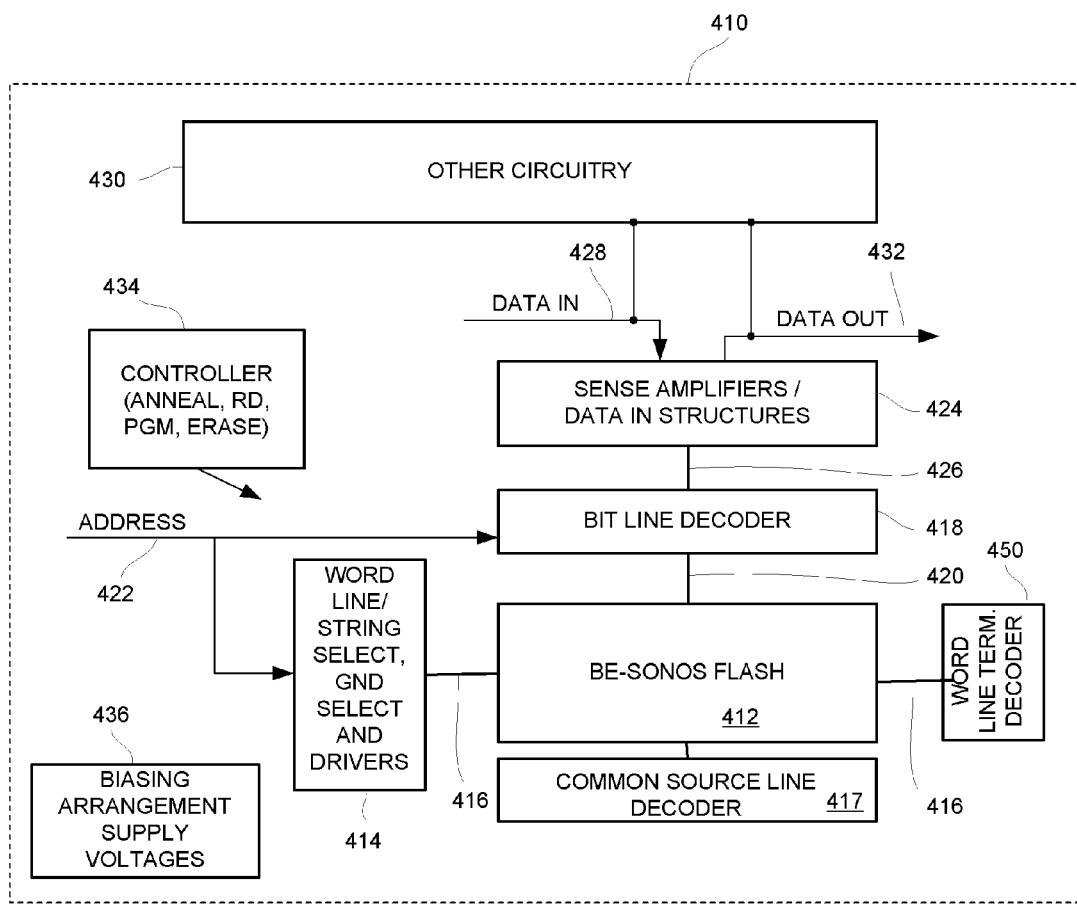
FIG. 4 is a block diagram of an integrated circuit memory arranged for thermal anneal operations.

FIG. 4 is a simplified block diagram of an integrated circuit employing thermal anneal for flash memory as described herein. The integrated circuit 410 includes a memory array 412 implemented using charge trapping memory cells on a semiconductor substrate. A word line (or row), ground select and string select decoder 414 (including appropriate drivers) are coupled to, and in electrical communication with, word lines 416, along with string select lines and ground select lines, arranged along rows in the memory array 412. A bit line (column) decoder and drivers 418 are coupled to and in electrical communication with a plurality of bit lines 420 arranged along columns in the memory array 412 for reading data from, and writing data to, the memory cells in the memory array 412. Addresses are supplied on bus 422 to the word line decoder and string select decoder 414 and to the bit line decoder 418. Optionally, a common source line decoder 417 can be included, and used for some memory operations.

In embodiments using current flow on the word lines to induce heat for thermal the annealing the dielectric charge trapping structures, a word line termination decoder 450 is coupled to the word lines 416 of the array. The word line termination decoder 450 can be responsive to addresses and control signals that indicate or are produced during an operating mode for the device to selectively connect word lines to termination circuits, or to enable termination circuits coupled to selected word lines, as discussed above.

Sense amplifiers and data-in structures in block 424, including current sources for the read, program and erase modes, are coupled to the bit line decoder 418 via data bus 426. Data is supplied via the data-in line 428 from input/output ports on the integrated circuit 410 or from other data sources internal or external to the integrated circuit 410, to the data-in structures in block 424. Data is supplied via the data-out line 432 from the sense amplifiers in block 424 to input/output ports on the integrated circuit 410, or to other data destinations internal or external to the integrated circuit 410.

A controller 434 implemented in this example, using a bias arrangement state machine, controls the application of bias arrangement supply voltages and current sources 436, such as read, program, erase, erase verify, program verify voltages or currents for the word lines and bit lines, and controls the word line/source line operation using an access control process. The controller 434 includes logic used to enable thermal annealing, including to control the word line termination decoder 450, in coordination with address decoding or otherwise, according to one or more of the processes described herein.

The controller 434 can be implemented using special purpose logic circuitry as known in the art. In alternative embodiments, the controller 434 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 434.

In the illustrated embodiment, other circuitry 430 is included on the integrated circuit 410, such as a general purpose processor or special purpose application circuitry, or a combination of modules providing system-on-a-chip functionality supported by the memory cell array.

A common technology for implementation of a NAND array includes the use of shallow trench isolation STI structures between strips of the semiconductor substrate. A series of memory cells is implemented in each strip. The memory cells include channel regions having one of n-type doping (for p-channel devices) or p-type doping (for n-channel devices), and source/drain regions between the channel regions along the strip having the opposite conductivity type. Charge trapping structures are formed over the channel regions, and word lines and bit lines are patterned to establish access to the NAND cells.

Figure 5:
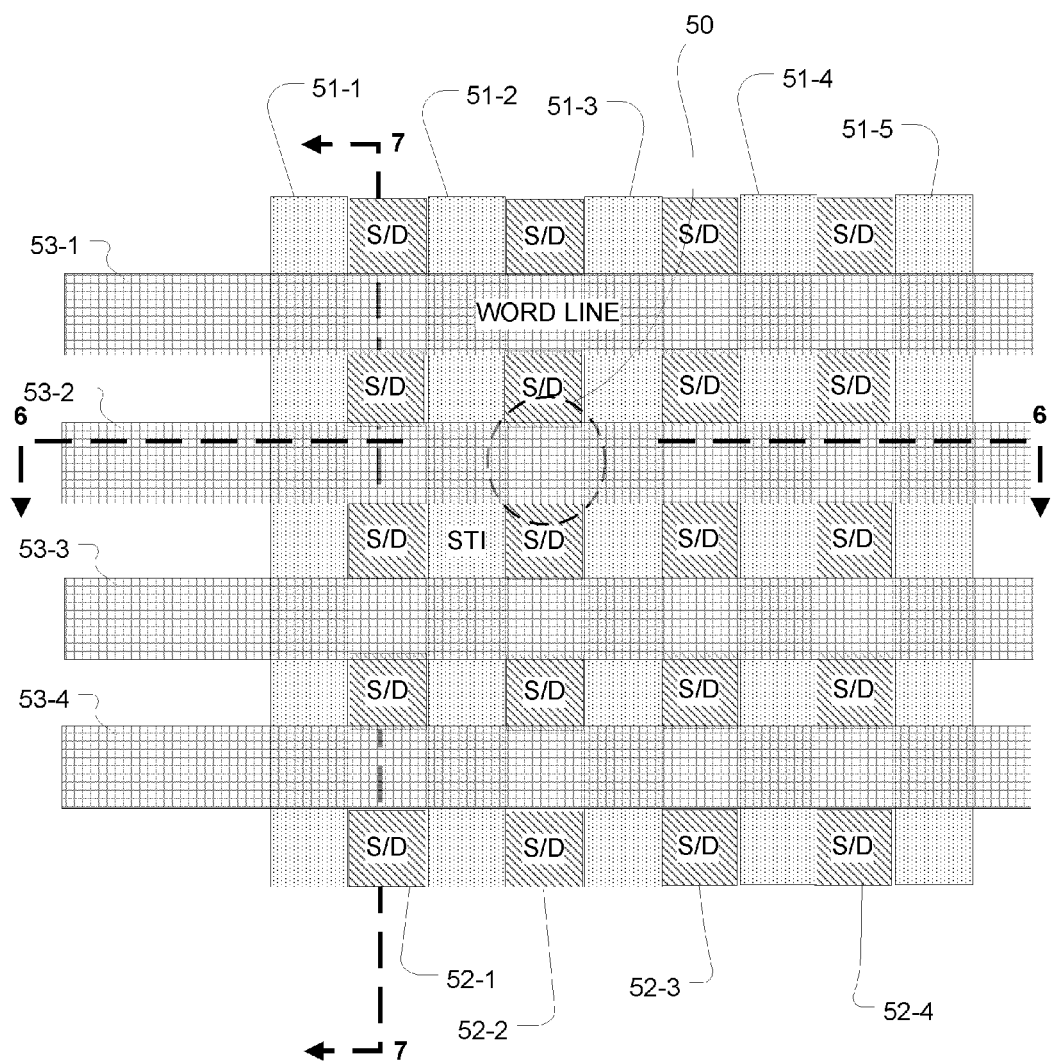
FIG. 5 is a layout view of a NAND array of memory cells, including insulation filled trenches between the columns, and implanted lateral pockets.

FIG. 5 shows a NAND array layout including shallow trench isolation between columns, suitable for use with the means for thermally annealing described herein. In the layout, a plurality of insulator filled trenches 51-1 through 51-5 is formed in the semiconductor substrate. Semiconductor strips 52-1 through 52-4 lie between pairs of the insulator filled trenches 51-1 through 51-5, such as shallow trench isolation STI sturtures. Charge trapping structures, not shown, overlie the semiconductor strips. A plurality of word lines 53-1 through 53-4 are formed over the charge trapping structures, and extend orthogonally relative to the semiconductor strips 52-1 through 52-4. The semiconductor strips include a plurality of source/drain regions (labeled S/D) having a first conductivity type and a plurality of channel regions (beneath the word lines) having a second conductivity type.

Figure 6:
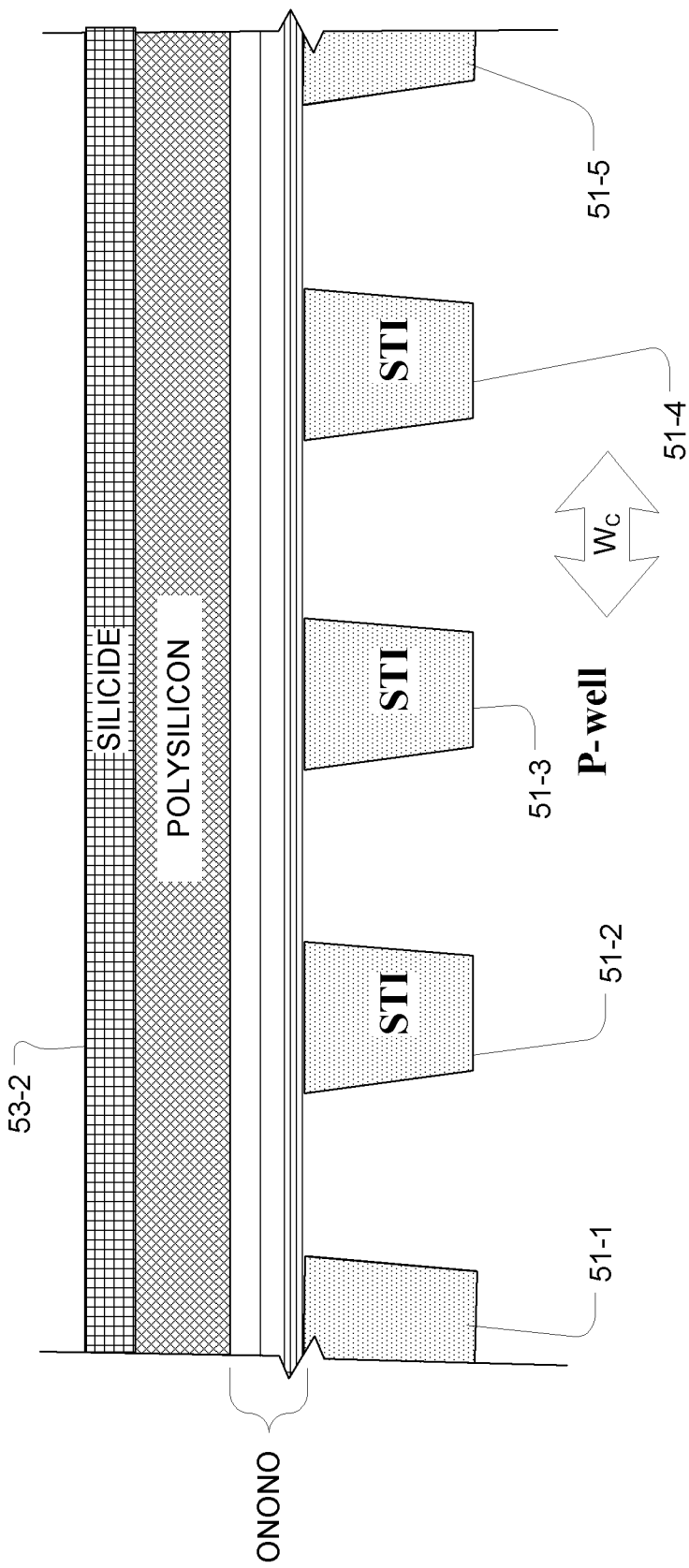
FIG. 6 s cross-section of an NAND array, like that of FIG. 5, using n-channel devices, taken along a word line.

FIG. 6 shows a cross section of the array of FIG. 5, taken along word line 53-2. The ONONO dielectric charge trapping structure, characteristic of BE-SONOS devices, lies between the word line 53-2 and the P-well in the semiconductor body. Insulator filled trenches 51-1 to 51-5 separate the NAND strings, which run perpendicular to the paper. The word lines may include multilayer structures of polysilicon and silicide, as shown, or other combinations of materials. The materials can be arranged to provide resistive heating during current flow, and for transfer of the resistive heating to the dielectric charge trapping structures for thermal anneal.

Figure 7:
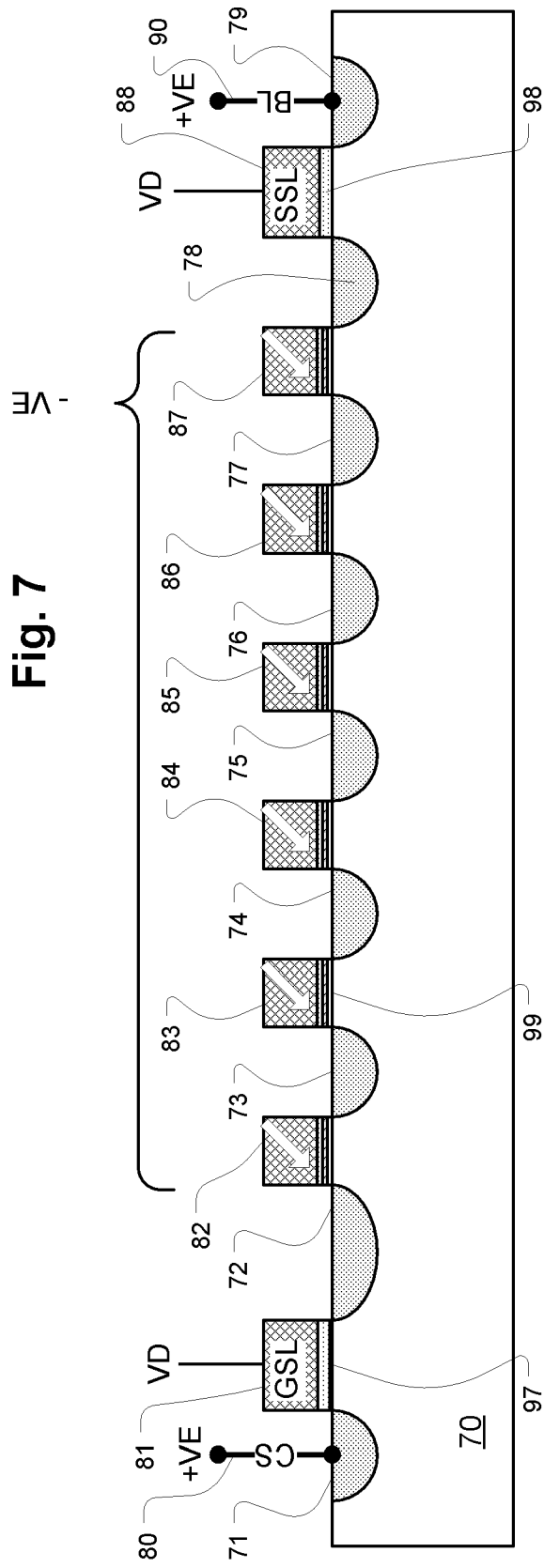
FIG. 7 is a simplified cross-sectional view of a NAND string, taken orthogonal to a word line through cell channels including top and bottom select transistors.

FIG. 7 shows in cross-section a plurality of dielectric charge trapping flash memory cells arranged in series to form a NAND string. The cross-section of FIG. 7 corresponds to a section taken along line 7-7 of FIG. 5, along a NAND string in strip 52-1, However, FIG. 7 shows a string six memory cells with ground select switches and string select switches, and thus more structure than appears in the layout of FIG. 5.

Referring to FIG. 7, the memory cells are formed in a semiconductor body 70. For n-channel memory cells, the semiconductor body 70 can be an isolated p-well, within a deeper n-well in a semiconductor chip. Alternatively, the semiconductor body 70 can be isolated by an insulating layer or otherwise. Some embodiments may employ p-channel memory cells in which the doping for the semiconductor body would be n-type.

The plurality of memory cells is arranged in a string extending in a bit line direction, orthogonal to word lines. Word lines 82-87 extend across a number of parallel NAND strings. Terminals 72-78 are formed by n-type regions (for n-channel devices) in the semiconductor body 70, and act as the source/drain regions for the memory cells. A first switch formed by a MOS transistor having a gate in a ground select line GSL 81 is connected between the memory cell corresponding with first word line 82 and a contact 71 formed by an n-type region in the semiconductor body 70. The contact 71 is connected to common source CS line 80. A second switch formed by a MOS transistor having a gate in a string select line SSL 88 is connected between the memory cell corresponding to the last word line 87 and a contact 79 formed by an n-type region in the semiconductor body 70. The contact 79 is connected to a bit line BL 90. The first and second switches in the illustrated embodiment are MOS transistors, having gate dielectrics 97 and 98 formed by, for example, silicon dioxide.

In this illustration, there are six memory cells in the string for simplicity. In typical implementations, a NAND string may comprise 16, 32 or more memory cells arranged in series. The memory cells corresponding to the word lines 82-87 have dielectric charge trapping structures 99 between the word lines and channel regions in the semiconductor body 70. Also, embodiments of NAND flash structures have been developed which are junction-free, where the terminals 73-77, and optionally terminals 72 and 78, may be omitted from the structure.

The charge trapping structure in the illustrated embodiment comprises an ONONO multilayer stack as described above. As mentioned above, the word lines are used to induce heat in the charge trapping structures (e.g. 99), and cause thermal anneal to recover from cycling damage. The annealing can also be applied during –FN erase, to improve erase speed.

Bias conditions are illustrated on the NAND string in FIG. 7 for a negative gate voltage FN (–FN) erase operation. To induce a block erase using –FN tunneling, the word lines are biased with a negative erase voltage –VE, and the bit line and common source line are biased with a positive erase voltage +VE or ground, while the string select switches are biased with a voltage to couple the +VE voltage to the semiconductor body 70. This sets up an electric field that induces hole tunneling from the channel to the charge trapping layer in the dielectric charge trapping structure, to erase the memory cells in the block. To improve erase performance, the word lines can be terminated, so that current flows during the block erase, as indicated by the arrows on the gate structures. The current flow induces heat that is transferred to the dielectric charge trapping structures, during the erase operation.

Alternative embodiments include a plurality of word lines, such as eight or sixteen, between a first n-type source/drain terminal, and a second n-type source/drain terminal, with a continuous p-type channel structure for n-channel devices, and vice versa for p-channel devices. Thus, embodiments of the NAND array as described herein may include more than one gate between the source/drain terminals doped with a conductivity type opposite that of the channel. Individual cells are accessed in this alternative by biasing the adjacent word lines in a manner that inverts the channel structure, creating inversion source/drain regions for individual gates. See, commonly owned, co-pending U.S. patent application Ser. No. 11/394,649 by Hsu et al., filed Mar. 31, 2006, which is incorporated by reference as if fully set forth herein.

NAND strings can be implemented in a variety of configurations, including finFET technology, shallow trench isolation technology, vertical NAND technology and others. See, for an example vertical NAND structures, European Patent Application No. EP 2 048 709 by Kim et al. entitled "Non-volatile memory device, method of operating same and method of fabricating the same."

Figure 8:
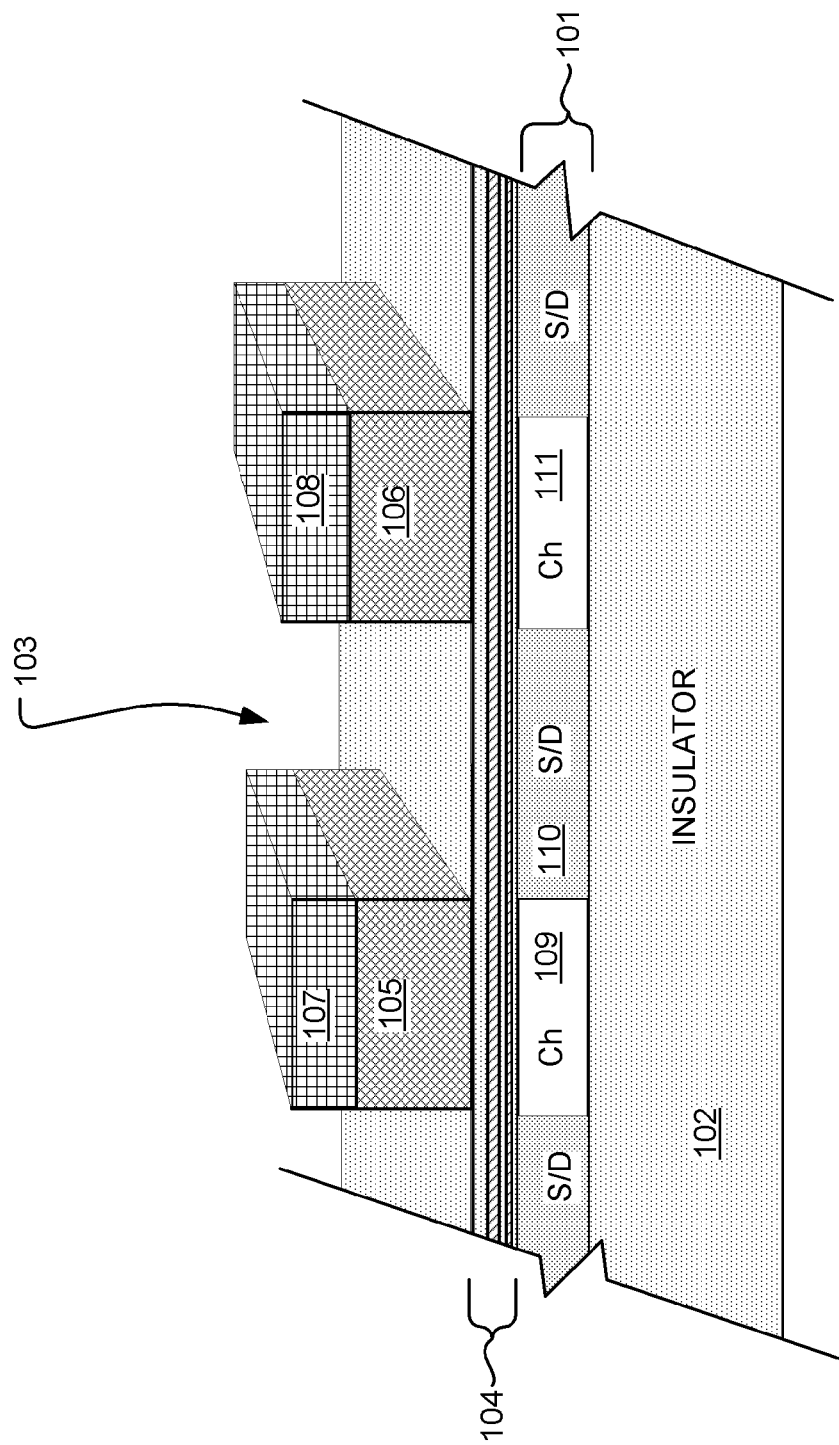
FIG. 8 illustrates an alternative structure of memory cells arranged for thermal anneal, including dielectric charge trapping memory cells arranged on thin film semiconductor bodies for thermal isolation.

FIG. 8 is a simplified perspective drawing of a memory structure including thin film transistor memory cells implemented on insulating substrate. This is a representative structure in which thermal isolation is taken into account in device design to provide for more efficient heat generation and lower power. In the structure, a "silicon on insulator SOI" design approach is implemented. An insulator 102 is formed on a substrate for the integrated circuit, providing both thermal and electrical insulation. A thin film semiconductor body 101 is formed over the insulator 102. Source/drain regions 110 and channel regions 109, 111 are implemented in the semiconductor body 101. A dielectric charge trapping structure 104 is formed over the thin film semiconductor body 101. Word lines are implemented using a multilayer structure, including respective layers of polysilicon 105, 106 and layers of silicide 107, 108. The thickness of the polysilicon/silicide layers can be reduced to increase resistance of the word lines, and thereby increase heat generation. Also, the thin film semiconductor body 101 implemented in a SOI type structure can reduce the heat absorption by the memory cells, allowing generation of higher temperatures at lower powers. Also, additional thermal insulating techniques can be used. For example, air spacers, and other thermally insulating structures, can be implemented between the word lines in the region 103.

Figure 9:
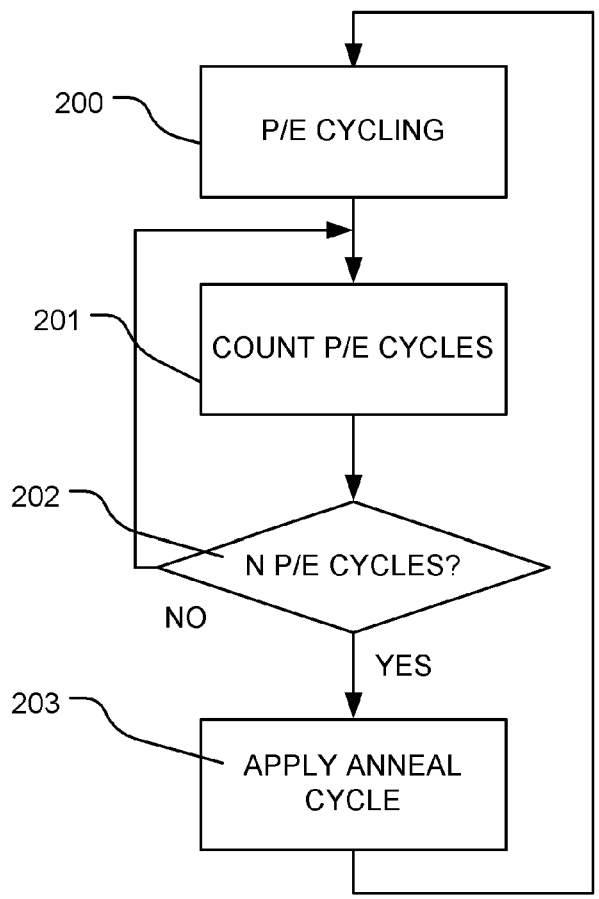
FIG. 9 is a simplified flow diagram of one control sequence for applying thermal anneal cycles.
Figure 10:
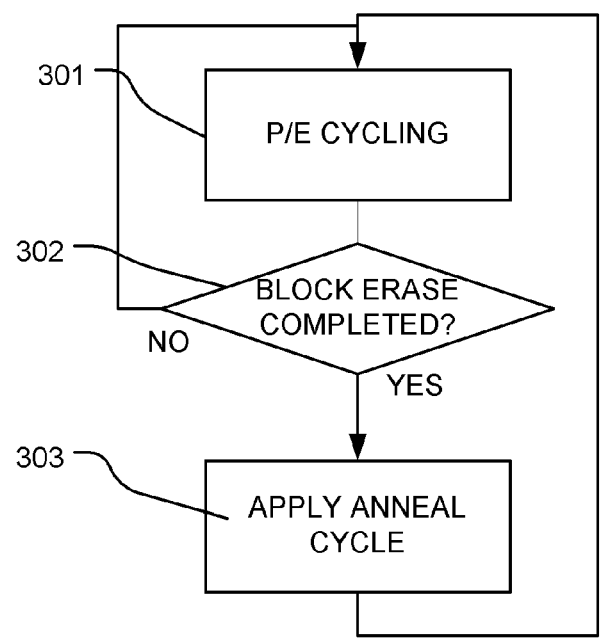
FIG. 10 is a simplified flow diagram of another control sequence for applying thermal anneal cycles.
Figure 11:
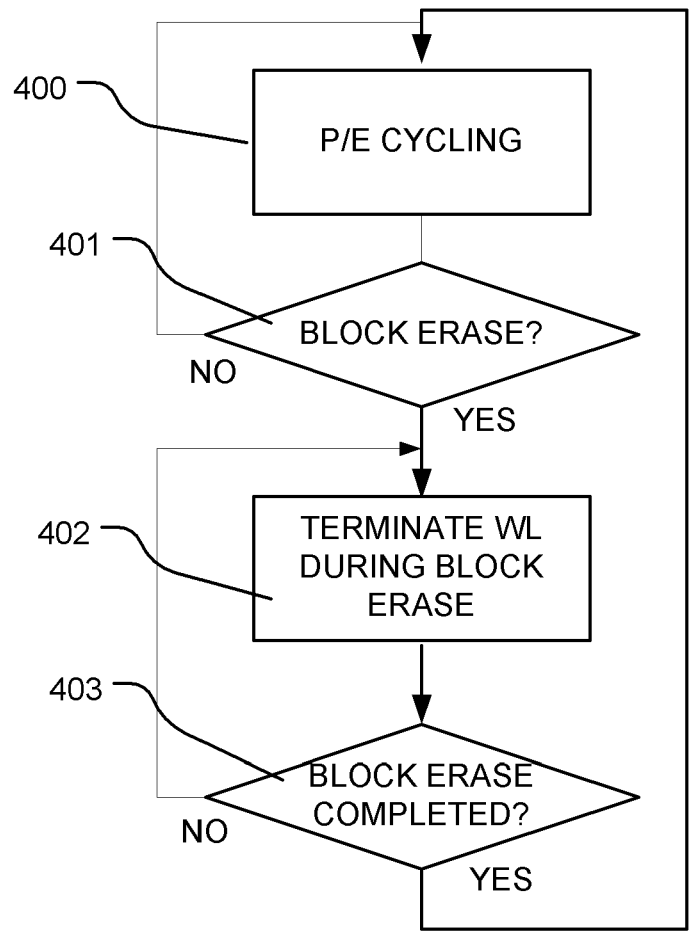
FIG. 11 is a simplified flow diagram of yet another control sequence for applying thermal anneal cycles.

FIGS. 9-11 illustrate alternative operating methods in which thermal anneal cycles are deployed in a dielectric charge trapping memory device. These methods can be executed using for example the controller 434 described with reference to FIG. 4.

FIG. 9 illustrates a representative process in which the thermal anneal cycles are interleaved among mission function operations (read, program, erase) for the memory device. During operation of the device, program/erase cycling operations are executed as represented by block 200. A controller for the method of FIG. 9 counts the program/erase cycles (e.g. by counting program operations, by counting erase operations, or by counting pairs of program and erase operations) (block 201), and monitors the count (block 202). If the count has not reached a threshold, then the algorithm loops to continue counting cycles. If the count reaches a threshold, then the controller applies a thermal anneal cycle (block 203). The program/erase cycle counting and thermal anneal cycles can be applied on sets of cells, such as on a row by row basis, on a column by column basis, on a block by block basis, or over an entire array as suits a particular implementation. The annealing can be applied to one row or column of cells at a time, or to larger sets of cells, as suits the power consumption requirements and other requirements of a given implementation.

FIG. 10 illustrates another process in which thermal anneal cycles are interleaved among mission function operations. In the process of FIG. 10, program/erase cycling operations are executed during normal operation as represented by block 301. The controller monitors for execution of a block erase function, and determines when a block erase operation has been completed (block 302). If no block erase operation is completed, then the process continues monitoring and normal operation. If a block erase operation successfully completes, then the controller applies a thermal anneal cycle (block 303).

FIG. 11 illustrates a representative process which the thermal anneal is applied during a mission function, a block erase in this example, for the memory device. In the process of FIG. 11, normal program/erase cycling for the memory device is taking place as represented by block 400. The process determines whether a block erase has been requested (block 401). If not, the process continues normal operations and monitoring. If a block erase operation is requested, then the controller terminates the word lines during the block erase operation, so that heat generating current is applied to the memory cells being erased, or otherwise applies the thermal anneal (block 402). As mentioned above, this can improve erase performance, as well as allow the dielectric charge trapping structures to recover from program/erase cycling damage. When the block erase function is completed (block 403), the process returns to normal operations.

Figure 12:
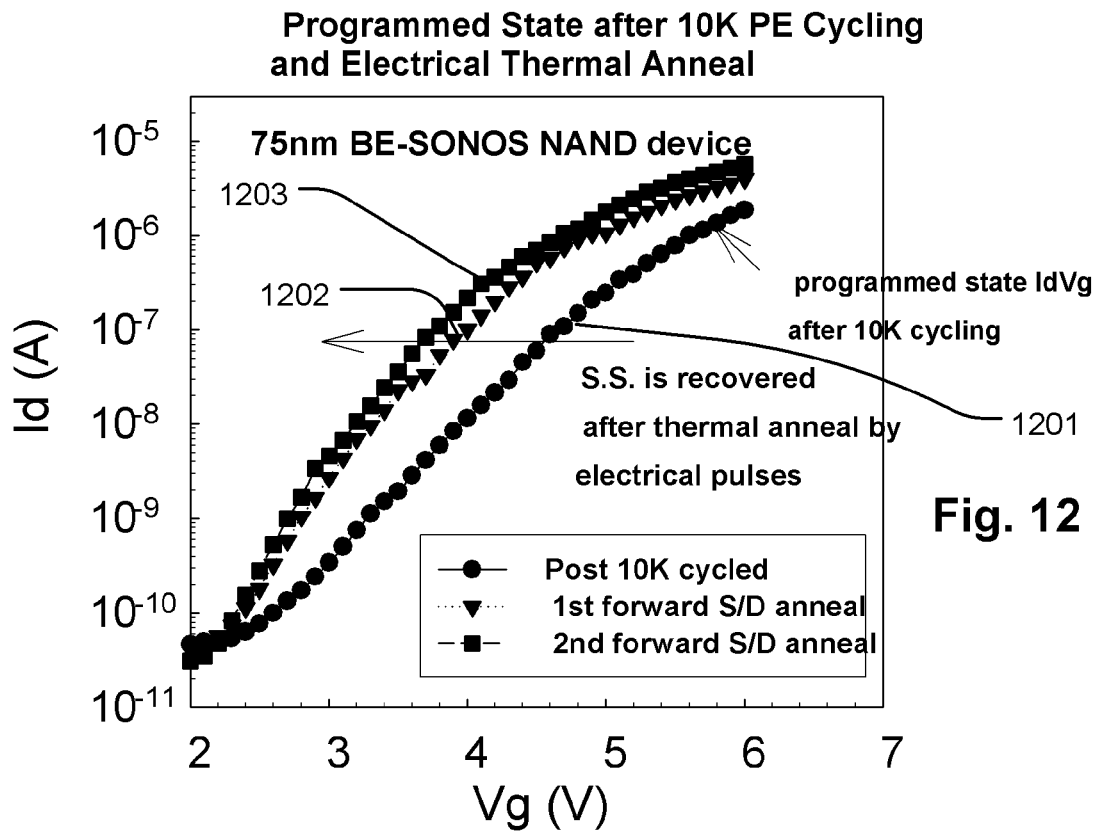
FIG. 12 is a plot of drain current versus control gate voltage showing experimental results of applying thermal anneal.
Figure 13:
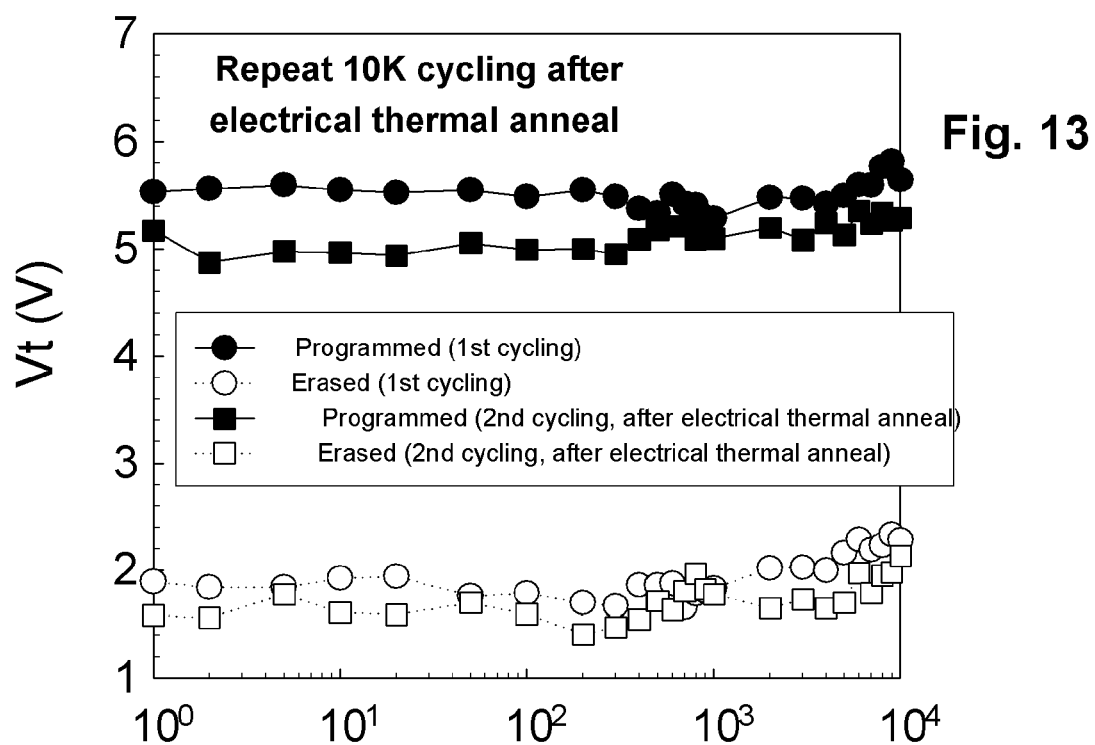
FIG. 13 is a plot of threshold voltage versus program/erase cycle count showing experimental results of applying thermal anneal.

FIGS. 12 and 13 illustrate measurements taken on an experimental device that comprised NAND architecture BE-SONOS memory cells made with a 75 nm manufacturing node, in which current to induce thermal anneal was generated by forward source/drain anneal, by which the junction between the source/drain terminal and the semiconductor body of the cell was forward biased to induce current flow. This emulates the behavior of other heating structures as discussed above. In FIG. 12, the drain current versus gate voltage plot is shown. Trace 1201 shows the performance of a memory cell after 10,000 program/erase cycles, illustrating a slight degradation in performance, presumably arising as a result of the cycling damages. Trace 1202 and trace 1203 show the performance after a first anneal and a second anneal, respectively. After the anneal steps, the sub-threshold slope for the device is significantly improved, indicating that interface state damage (Dit) is suppressed using thermal anneal.

FIG. 13 shows threshold voltage versus cycle count for program/erase cycling of the tested memory cell, for 10,000 cycles before anneal, and 10,000 cycles after anneal. The figure illustrates that the device performs equally well both for the 10,000 cycles before anneal and the next 10,000 cycles after anneal.

Figure 14:
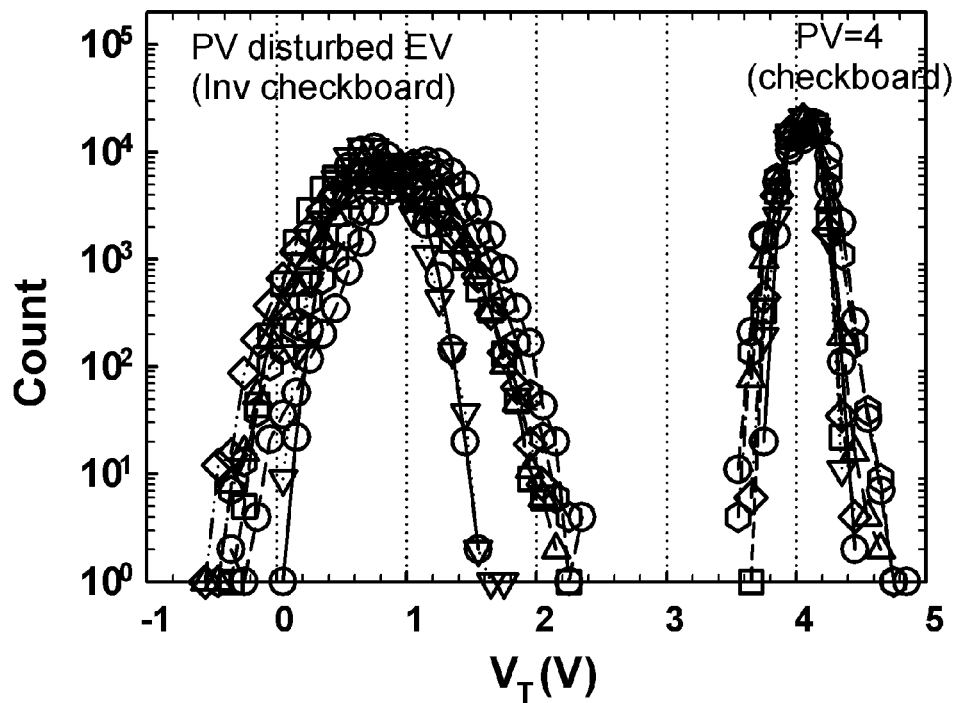
FIG. 14 is a plot of threshold voltage distribution for programmed and erased cells after a first cycling sequence.
Figure 15:
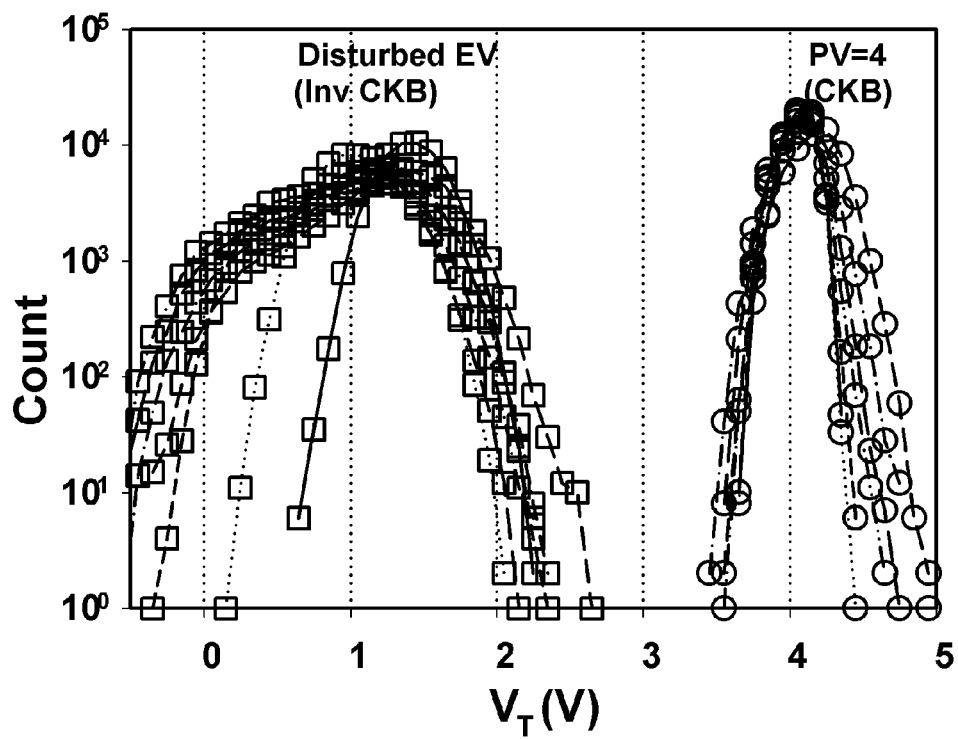
FIG. 15 is a plot of threshold voltage distribution for programmed and erased cells after a second cycling sequence following a thermal anneal.
Figure 16:
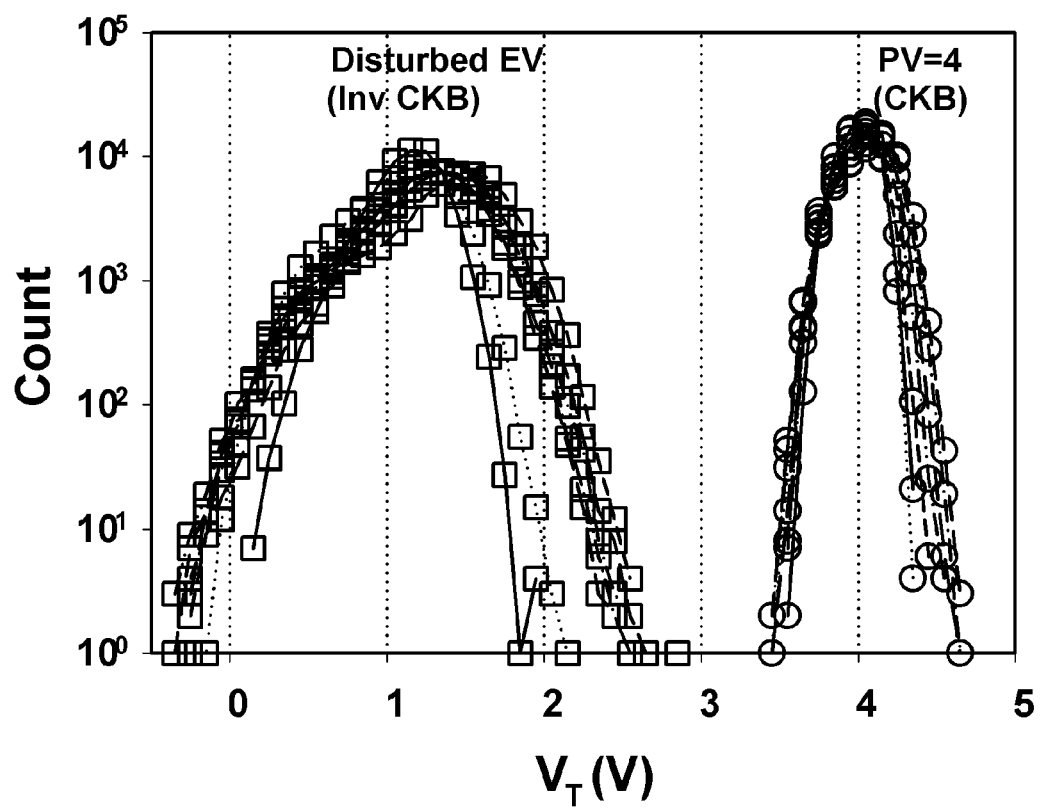
FIG. 16 is a plot of threshold voltage distribution for programmed and erased cells after ten cycling and annealing sequences.

FIGS. 14-16 shows threshold distribution for a first set of 100,000 program/erase cycles on the tested NAND architecture BE-SONOS memory cells, for a second set of 100,000 program/erase cycles after a thermal anneal, and for a tenth set of 100,000 program/erase cycles after thermal anneal, respectively. In FIG. 14, seven plots are shown that are not readily distinguished. The plots correspond to performance at 10 cycles, performance at 100 cycles, performance at 1000 cycles, performance at 10,000 cycles, performance at 50,000 cycles, and performance at 100,000 cycles. FIG. 14 shows that as the cycling count increases, to about 100, the upper edge of the erase state window reaches about 2.3 V. The program state window remains relatively constant, having a lower edge at about 3.5 V.

FIG. 15 shows that for a second set of 100,000 cycles after a thermal anneal, the upper edge of the erase state window stays below about 2.6 V while the program state window stays above about 3.5 V. FIG. 16 shows that for the tenth set of 100,000 cycles after thermal anneal, the erase state window remains below about 2.9 V, while the program state window remains above about 3.4 V.

The results illustrated in FIGS. 14-16 illustrate that device performance can be maintained over 1 million cycles using the thermal annealing process every 100,000 cycles.

Figure 17:
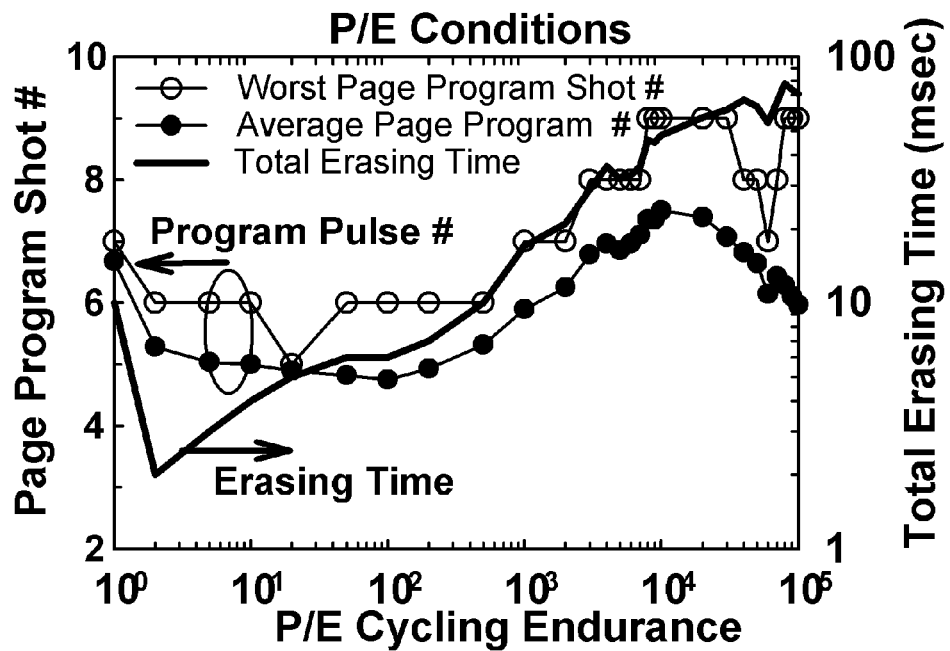
FIG. 17 is a plot showing program and erase conditions after a first cycling sequence.
Figure 18:
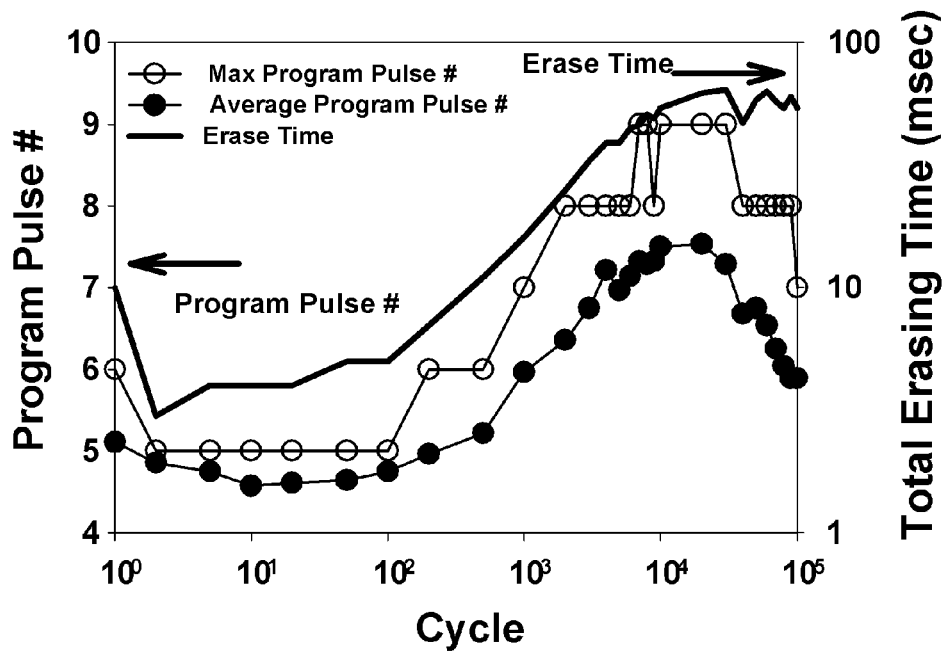
FIG. 18 is a plot showing program and erase conditions after a second cycling sequence following a thermal anneal.
Figure 19:
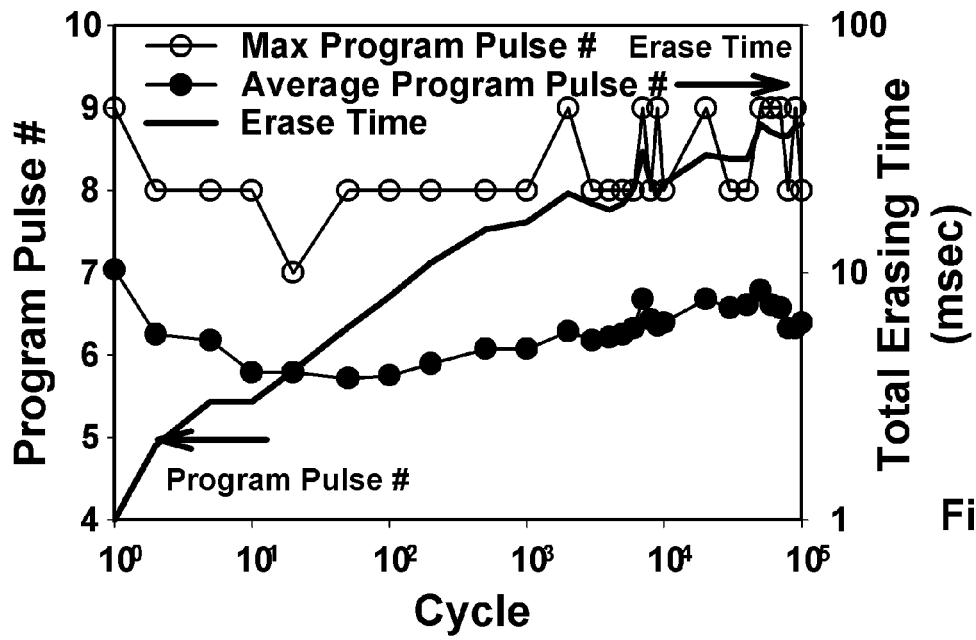
FIG. 19 is a plot showing program and erase conditions after ten cycling and annealing sequences.

FIGS. 17-19 show page program shot count (i.e. the number of program pulses required for successful programming in a program, verify, retry cycling algorithm) and total erasing time variations over 100,000 program/erase cycles. The figures show traces for worst case count of page program shots, an average number of page program shots, and a total erasing time traces. FIG. 17 shows the performance for a first set of 100,000 cycles. FIG. 18 shows the performance for a second set of 100,000 cycles after thermal anneal. FIG. 19 shows the performance for a tenth set of 100,000 cycles with thermal annealing. These figures illustrate that the program/erase cycling conditions are almost fully recovered after the tenth set of 100,000 P/E cycles, followed by a thermal anneal, showing endurance of over one million cycles.

Figure 20:
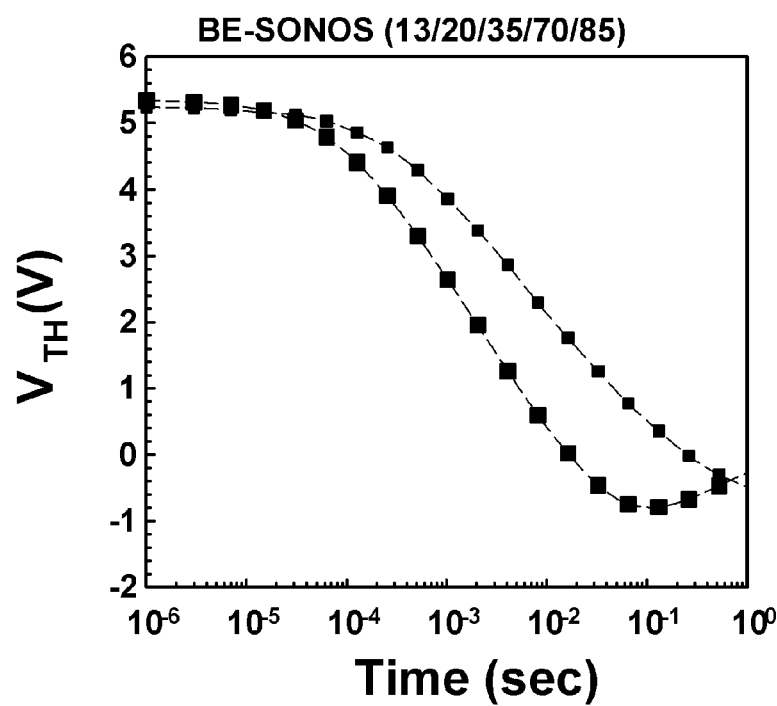
FIG. 20 showing erase performance at room temperature and at elevated temperatures for a charge trapping memory cell.

FIG. 20 illustrates erase performance with and without thermal anneal for a BE-SONOS memory cell having a multilayer tunneling layer that comprises 1.3 nm of silicon oxide, 2 nm of silicon nitride, and 3.5 nm of silicon oxide, a charge trapping layer that comprises 7 nanometers of silicon nitride, and a blocking layer that comprises 8.5 nm of silicon oxide. A −FN erase bias of −17 volts is applied across the gate and body of the device. The erase time at 25° C. for a threshold drop from about 5 V to about 0 V under these conditions is close to 1 second. At an elevated temperature of 250°, the erase time under these conditions falls to about 11 milliseconds. Thus, FIG. 20 shows that applying thermal annealing during and erase operation can improve erase performance.

Figure 21:
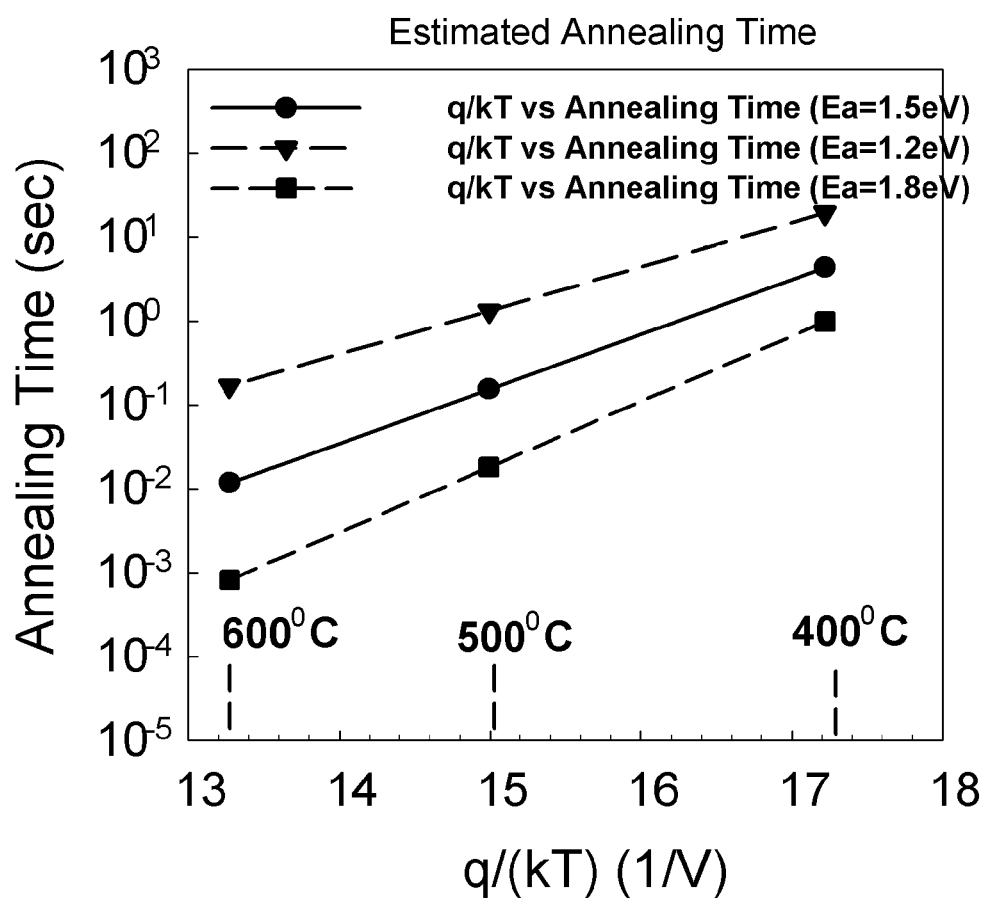
FIG. 21 is a graph of estimated annealing time for charge trapping memory cells undergoing and erase operation.

FIG. 21 is an Arrhenius plot of annealing time in seconds versus $q/(kT)$, showing an estimated annealing time for thermally assisted erase operations in a BE-SONOS device. Three traces are shown, where the uppermost trace assumes an activation energy of 1.2 electron volts, the trace in the middle assumes activation energy of 1.5 electron volts, and the lower trace assumes activation energy of 1.8 electron volts. Also, for the calculations, it is assumed, based on experimentation that the annealing time required for recovery is about two hours at 250° C. Based on the calculation shown in the plot, at a temperature of about 600° C., the annealing time required will be only a few milliseconds, and is therefore suitable for use within erase speed requirement of current flash memory specifications. Temperatures on the order of 600° C. can be achieved using resistive heating as described herein.

A thermally assisted charge-trapping memory has been described. The technology is suitable for use with flash devices having NAND architectures, as well as devices using other architectures. Heat can be generated for thermal annealing using resistive heating caused by current flow in the word lines for example, in a manner that it easily implemented in integrated circuit devices. By applying the thermal annealing operations, improved endurance and/or increased erase the can be achieved.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
   an array of memory cells including word lines and bit lines, memory cells in the array having dielectric charge trapping structures, wherein the dielectric charge trapping structures include a tunneling layer, a charge trapping layer and a blocking layer, and wherein the tunneling layer includes a first layer of silicon oxide or silicon oxynitride less than 2 nm thick, a second layer of silicon nitride less than 3 nm thick, and a third layer comprising silicon oxide or silicon oxynitride less than 4 nm thick;
   control circuitry coupled to the array arranged to control read, program and erase operations; and
   means coupled to the array for thermally annealing the dielectric charge trapping structures in the memory cells in the array.

2. The memory of claim 1, wherein said means includes circuitry to produce current in selected word lines in the array, whereby heat for the annealing is produced in the memory cells.

3. The memory of claim 1, wherein said means includes word line drivers, and word line termination circuits responsive to decoder circuitry to drive a current on corresponding word lines.

4. The memory of claim 1, the control circuitry including logic to enable the means for thermally annealing during a block erase.

5. The memory of claim 1, the control circuitry including logic to enable the means for thermally annealing either interleaved with, or during program operations, read operations and erase operations.

6. The memory of claim 1, the control circuitry including logic to maintain a count of program and erase cycles, and when the count reaches a threshold, to enable the means for thermally annealing.

7. The memory of claim 1, the control circuitry including logic to enable the means for thermally annealing during erase operations in which a negative voltage is applied to selected word lines.

8. The memory of claim 1, wherein the array is arranged in a NAND architecture.

9. The memory of claim 1, wherein memory cells in the array comprise semiconductor bodies on an insulating substrate.

10. A memory comprising:
    an array of memory cells including word lines and bit lines, memory cells in the array having dielectric charge trapping structures, wherein the dielectric charge trapping structures include a tunneling layer, a charge trapping layer and a blocking layer, and wherein the tunneling layer includes a first layer of silicon oxide or silicon oxynitride less than 2 nm thick, a second layer of silicon nitride less than 3 nm thick, and a third layer comprising silicon oxide or silicon oxynitride less than 4 nm thick;
    an address decoder coupled to the array;
    control circuitry coupled to the array arranged to control read, program and erase operations; and
    a plurality of word line drivers and word line termination circuits coupled to word lines in the array, and responsive to the control circuitry and the decoders to apply current to selected word lines.

11. The memory of claim 10, the control circuitry including logic to control the word line drivers and the word line termination circuits to induce current flow in selected word lines during a block erase.

12. The memory of claim 10, the control circuitry including logic to control the word line drivers and the word line termination circuits to induce current flow in selected word lines either interleaved among, or during, the read, program and erase operations.

13. The memory of claim 10, the control circuitry including logic to control the word line drivers and the word line termination circuits to induce current flow in selected word lines during erase operations in which a negative voltage is applied to the selected word lines.

14. The memory of claim 10, the control circuitry including logic to maintain a count of program and erase cycles, and when the count reaches a threshold, to control the word line drivers and the word line termination circuits to induce current flow in selected word lines.

15. The memory of claim 10, wherein the array is arranged in a NAND architecture.

16. The memory of claim 10, wherein memory cells in the array comprise semiconductor bodies on an insulating substrate.

17. A method for operating an array of memory cells including word lines and bit lines, memory cells in the array having dielectric charge trapping structures; the method comprising:
    performing read, program and erase operations; and
    either interleaved among, or during, the read, program and erase operations, thermally annealing charge trapping structures in the memory cells in the array, wherein the dielectric charge trapping structures include a tunneling layer, a charge trapping layer and a blocking layer, and wherein the tunneling layer includes a first layer of silicon oxide or silicon oxynitride less than 2 nm thick, a second layer of silicon nitride less than 3 nm thick, and a third layer comprising silicon oxide or silicon oxynitride less than 4 nm thick.

18. The method of claim 17, including applying current to word lines in the array to induce heat for the annealing.

19. The method of claim 17, including applying current to selected word lines during a block erase, to induce heat for the annealing.

20. The method of claim 17, including performing said thermally annealing during at least one of program operations, read operations and erase operations.

21. The method of claim 17, including maintaining a count of program and erase cycles, and when the count reaches a threshold, performing said thermally annealing.

22. The method of claim 17, including performing said thermally annealing during erase operations in which a negative voltage is applied to the selected word lines.

* * * * *